(12) United States Patent
Take et al.

(10) Patent No.: US 12,156,337 B2
(45) Date of Patent: Nov. 26, 2024

(54) WIRING BOARD AND METHOD FOR MANUFACTURING WIRING BOARD

(71) Applicant: Dai Nippon Printing Co., Ltd., Tokyo (JP)

(72) Inventors: Seiji Take, Tokyo (JP); Shuji Kawaguchi, Tokyo (JP); Chiaki Hatsuta, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 224 days.

(21) Appl. No.: 17/996,805

(22) PCT Filed: Apr. 28, 2021

(86) PCT No.: PCT/JP2021/017032
§ 371 (c)(1),
(2) Date: Oct. 21, 2022

(87) PCT Pub. No.: WO2021/221119
PCT Pub. Date: Nov. 4, 2021

(65) Prior Publication Data
US 2023/0062683 A1    Mar. 2, 2023

(30) Foreign Application Priority Data

May 1, 2020    (JP) .............................. 2020-081050

(51) Int. Cl.
*H05K 1/02*    (2006.01)
*H01Q 1/36*    (2006.01)
(Continued)

(52) U.S. Cl.
CPC ............. *H05K 1/181* (2013.01); *H01Q 1/364* (2013.01); *H01Q 1/38* (2013.01); *H05K 1/0274* (2013.01);
(Continued)

(58) Field of Classification Search
CPC ....... H05K 1/0274; H05K 2201/09681; H05K 2203/0307
See application file for complete search history.

(56) References Cited

U.S. PATENT DOCUMENTS 8,570,225 B2    10/2013    Shoji et al.
10,379,645 B2   8/2019    Hondo
(Continued)

FOREIGN PATENT DOCUMENTS

JP    2011-066610 A    3/2011
JP    5636735 B2       12/2014
(Continued)

OTHER PUBLICATIONS

English translation of International Preliminary Report on Patentability (Chapter I) (Application No. PCT/JP2021/017032) dated Nov. 10, 2022.
(Continued)

*Primary Examiner* — Sherman Ng
(74) *Attorney, Agent, or Firm* — BURR PATENT LAW, PLLC

(57) ABSTRACT

A wiring board (10) includes a substrate (11) and a mesh wiring layer (20) disposed on the substrate (11) and including a plurality of wiring lines (21, 22). The substrate (11) has a transmittance of 85% or more for light with a wavelength of 400 nm or more and 700 nm or less. The wiring lines (21, 22) have a surface roughness Ra, and the surface roughness Ra is 100 nm or less.

18 Claims, 8 Drawing Sheets

(51) Int. Cl.
      *H01Q 1/38*      (2006.01)
      *H05K 1/18*      (2006.01)
      *H05K 3/30*      (2006.01)

(52) U.S. Cl.
      CPC ... *H05K 3/303* (2013.01); *H05K 2201/10098* (2013.01)

(56) References Cited

U.S. PATENT DOCUMENTS

| | | |
|---|---|---|
| 2008/0096022 A1 | 4/2008 | Naito et al. |
| 2016/0011698 A1* | 1/2016 | Tajiri ................. G03F 7/32 345/174 |
| 2018/0040846 A1 | 2/2018 | Kojima et al. |
| 2019/0073065 A1* | 3/2019 | Ogura .................. H05K 1/02 |
| 2020/0170125 A1* | 5/2020 | Saito ................... H05K 3/10 |

FOREIGN PATENT DOCUMENTS

| | | |
|---|---|---|
| JP | 5695947 B2 | 4/2015 |
| JP | 2017-185690 A | 10/2017 |
| WO | 2016/104723 A1 | 6/2016 |

OTHER PUBLICATIONS

Extended European Search Report (Application No. 21795893.3) dated Mar. 6, 2024 (8 pages).
International Search Report and Written Opinion (Application No. PCT/JP2021/017032) dated Jun. 22, 2021 (with English translation).

* cited by examiner

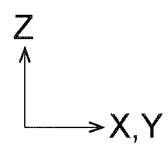

WIRING BOARD AND METHOD FOR MANUFACTURING WIRING BOARD

TECHNICAL FIELD

An embodiment of the present disclosure relates to a wiring board and a method for manufacturing the wiring board.

BACKGROUND ART

Presently, smaller, thinner, and lighter portable terminal devices, such as smartphones and tablets, with higher functionality are being developed. These portable terminal devices use a plurality of communication bands, and therefore require a plurality of antennas corresponding to the communication bands. For example, a portable terminal device may include a plurality of antennas including a telephone antenna, a wireless fidelity (WiFi) antenna, a third generation (3G) antenna, a fourth generation (4G) antenna, a long term evolution (LTE) antenna, a Bluetooth (registered trademark) antenna, and a near field communication (NFC) antenna. However, to reduce the size of the portable terminal device, the space in which the antennas are arranged is limited, and the design flexibility of the antennas is reduced. In addition, since the antennas are arranged in a limited space, the radio wave sensitivity is not always satisfactory.

Accordingly, film antennas mountable in a display region of a portable terminal device have been developed. A film antenna is a transparent antenna including a transparent base material on which an antenna pattern is formed. The antenna pattern is formed of a conductor mesh layer having a mesh structure, which includes a conductor portion composed of an opaque conductor layer and a plurality of openings in which no conductor layer is formed.

PRIOR ART REFERENCES

Patent Documents

[Patent Document 1] Japanese Unexamined Patent Application Publication No. 2011-66610
[Patent Document 2] Japanese Patent No. 5636735
[Patent Document 3] Japanese Patent No. 5695947

The film antenna according to the related art includes a mesh wiring layer (conductor mesh layer) provided on a transparent base material. In recent years, high-frequency electromagnetic waves have been used in film antennas. When high-frequency electromagnetic waves are used, electrons pass through grain boundaries in the metal forming the mesh wiring layer a greater number of times per unit time. Therefore, current flow may be reduced, and transmission loss may be increased.

The present embodiment provides a wiring board in which reduction in current flow through the mesh wiring layer can be suppressed and a method for manufacturing the wiring board.

DISCLOSURE OF THE INVENTION

A wiring board according to the present embodiment includes a substrate and a mesh wiring layer disposed on the substrate and including a plurality of wiring lines. The substrate has a transmittance of 85% or more for light with a wavelength of 400 nm or more and 700 nm or less. The wiring lines have a surface roughness Ra, and the surface roughness Ra is 100 nm or less.

In the wiring board according to the present embodiment, the wiring lines may include metal crystals, and an area average grain size of the metal crystals may be 300 nm or more.

In the wiring board according to the present embodiment, the wiring lines may have a line width of 0.1 μm or more and 5.0 μm or less.

In the wiring board according to the present embodiment, the mesh wiring layer may be an antenna.

In the wiring board according to the present embodiment, the wiring lines may include gold, silver, copper, platinum, tin, aluminum, iron, or nickel.

In the wiring board according to the present embodiment, the substrate may have a dielectric loss tangent of 0.002 or less.

In the wiring board according to the present embodiment, the substrate may have a thickness of 5 μm or more and 200 μm or less.

In the wiring board according to the present embodiment, the substrate may include cycloolefin polymer or polynorbornene polymer.

In the wiring board according to the present embodiment, the mesh wiring layer may be provided only on a portion of the substrate.

In the wiring board according to the present embodiment, the surface roughness Ra may be 90 nm or less.

A method for manufacturing a wiring board according to the present embodiment includes a step of preparing a substrate and a step of forming a mesh wiring layer including a plurality of wiring lines on the substrate. The substrate has a transmittance of 85% or more for light with a wavelength of 400 nm or more and 700 nm or less. The wiring lines have a surface roughness Ra, and the surface roughness Ra is 100 nm or less.

In the method for manufacturing the wiring board according to the present embodiment, the wiring lines may include metal crystals, and an area average grain size of the metal crystals may be 300 nm or more.

In the method for manufacturing the wiring board according to the present embodiment, the wiring lines may have a line width of 0.1 μm or more and 5.0 μm or less.

In the method for manufacturing the wiring board according to the present embodiment, the mesh wiring layer may be an antenna.

In the method for manufacturing the wiring board according to the present embodiment, the wiring lines may include gold, silver, copper, platinum, tin, aluminum, iron, or nickel.

In the method for manufacturing the wiring board according to the present embodiment, the substrate may have a dielectric loss tangent of 0.002 or less.

In the method for manufacturing the wiring board according to the present embodiment, the substrate may have a thickness of 5 μm or more and 200 μm or less.

In the method for manufacturing the wiring board according to the present embodiment, the substrate may include cycloolefin polymer or polynorbornene polymer.

In the method for manufacturing the wiring board according to the present embodiment, the mesh wiring layer may be provided only on a portion of the substrate.

In the method for manufacturing the wiring board according to the present embodiment, the surface roughness Ra may be 90 nm or less.

According to the embodiment of the present disclosure, reduction in current flow through the mesh wiring layer can be suppressed.

DESCRIPTION OF EMBODIMENTS

An embodiment will be described with reference to FIGS. 1 to 10. FIGS. 1 to 10 illustrate the present embodiment.

Drawings described below are schematic diagrams. Therefore, sizes and shapes of the components are exaggerated as appropriate to facilitate understanding. Changes are possible as appropriate without departing from the technical idea. In each of the drawings described below, the same parts are denoted by the same reference signs, and detailed description thereof may be omitted. The numerical values of, for example, the dimensions and the materials of components described in this specification are examples of the embodiment. The numerical values and materials are not limited to the examples, and may be selected as appropriate. In this specification, terms relating to shapes and geometric conditions, such as "parallel", "orthogonal", and "perpendicular", are to be interpreted not only in a strict sense but also to cover states that are substantially the same as those in a strict sense.

In the embodiment described below, an "X direction" is a direction parallel to one side of a substrate. A "Y direction" is a direction perpendicular to the X direction and parallel to another side of the substrate. A "Z direction" is a direction perpendicular to both the X direction and the Y direction and parallel to a thickness direction of a wiring board. A "front surface" is a surface that faces in a positive Z direction and on which wiring lines are provided on the substrate. A "back surface" is a surface that faces in a negative Z direction and that is opposite to the surface on which the wiring lines are provided on the substrate.

[Structure of Wiring Board]

The structure of a wiring board according to the present embodiment will be described with reference to FIGS. 1 to 7. FIGS. 1 to 7 illustrate the wiring board according to the present embodiment.

Figure 1:
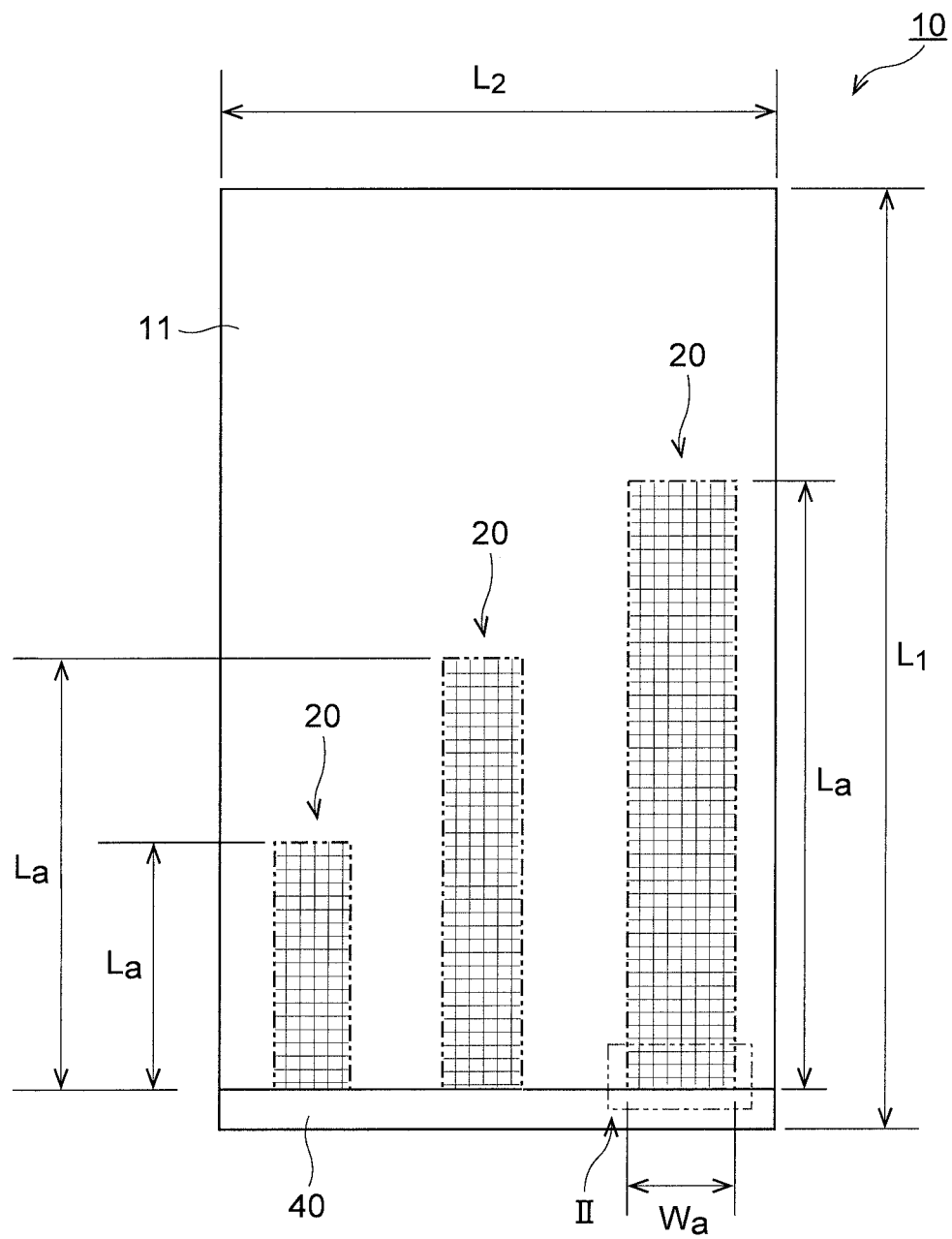
FIG. 1 is a plan view of a wiring board according to an embodiment.

As illustrated in FIG. 1, a wiring board 10 according to the present embodiment is disposed on, for example, a display of an image display device. The wiring board 10 includes a transparent substrate 11 and mesh wiring layers (wiring pattern regions) 20 arranged on the substrate 11. The mesh wiring layers 20 are electrically connected to a feeding unit 40.

The substrate 11 is substantially rectangular in plan view. The longitudinal direction of the substrate 11 is parallel to the Y direction, and the transverse direction of the substrate 11 is parallel to the X direction. The substrate 11, which is transparent, is substantially flat plate-shaped, and has a substantially uniform thickness over the entirety thereof. A length $L_1$ of the substrate 11 in the longitudinal direction (Y direction) may be selected from the range of, for example, 2 mm or more and 300 mm or less, preferably from the range of 100 mm or more and 200 mm or less. A length $L_2$ of the substrate 11 in the transverse direction (X direction) may be selected from the range of 2 mm or more and 300 mm or less, preferably from the range of, for example, 50 mm or more and 100 mm or less. The substrate 11 may have rounded corners.

The material of the substrate 11 may be any material that is transparent in the visible light range and that has electrically insulating properties. The material of the substrate 11 is polyethylene terephthalate in the present embodiment, but is not limited to this. The material of the substrate 11 is preferably an organic insulating material, for example, a polyester-based resin such as polyethylene terephthalate, an acrylic resin such as polymethyl methacrylate, a polycarbonate-based resin, a polyimide-based resin, a polyolefin-based resin such as cycloolefin polymer, or a cellulose-based resin material such as triacetyl cellulose. Alternatively, the material of the substrate 11 may be an organic insulating material such as cycloolefin polymer (for example, ZF-16 produced by Zeon Corporation) or polynorbornene polymer (produced by Sumitomo Bakelite Co., Ltd.). The material of the substrate 11 may instead be glass, ceramic, etc., as appropriate depending on the use. Although the substrate 11 is composed of a single layer in the illustrated example, the substrate 11 is not limited to this, and may instead have a multilayer structure including a plurality of base materials or layers. The substrate 11 may be film-shaped or plate-shaped. Thus, the thickness of the substrate 11 is not particularly limited, and may be selected as appropriate depending on the use. For example, a thickness (in the Z direction) $T_1$ of the substrate 11 (see FIGS. 4 and 5) may be in the range of, for example, 5 µm or more and 200 µm or less.

The substrate 11 may have a dielectric loss tangent of 0.002 or less, preferably 0.001 or less. The dielectric loss tangent of the substrate 11 has no particular lower limit, but may be more than 0. When the dielectric loss tangent of the substrate 11 is within the above-mentioned ranges, loss in gain (sensitivity) during transmission and reception of electromagnetic waves may be reduced, particularly in a case where high-frequency electromagnetic waves (for example, millimeter waves) are transmitted and received by the mesh wiring layers 20. The dielectric loss tangent of the substrate 11 has no particular lower limit. The dielectric constant of the substrate 11 is not particularly limited, and may instead be 2.0 or more and 10.0 or less.

The dielectric loss tangent of the substrate 11 may be measured in accordance with IEC 62562. More specifically, first, a specimen is prepared by cutting out a portion of the substrate 11 on which no mesh wiring layers 20 are formed. Alternatively, a portion of the substrate 11 on which the mesh wiring layers 20 are formed may be cut out, and then the mesh wiring layers 20 may be removed by, for example, etching. The specimen has a width in the range of 10 mm to 20 mm and a length in the range of 50 mm to 100 mm. Next, the dielectric loss tangent is measured in accordance with IEC 62562. The dielectric constant and the dielectric loss tangent of the substrate 11 may also be measured in accordance with ASTM D150.

The transmittance of the substrate 11 for visible light (light with a wavelength of 400 nm or more and 700 nm or less) may be 85% or more, preferably 90% or more. The transmittance of the substrate 11 for visible light has no particular upper limit, but may be, for example, 100% or less. When the transmittance of the substrate 11 for visible light is within the above-mentioned ranges, transparency of the wiring board 10 can be increased, and visibility of a display 91 of an image display device 90 (described below) can be enhanced. The visible light is light with a wavelength of 400 nm to 700 nm. The transmittance for visible light of 85% or more means that when the absorbance of the substrate 11 is measured with a known spectrophotometer (for example, spectrometer V-670 manufactured by JASCO Corporation), the transmittance is 85% or more over the entire wavelength range of 400 nm to 700 nm.

In the present embodiment, the mesh wiring layers 20 are composed of antenna pattern regions having a function of an antenna. In FIG. 1, the mesh wiring layers 20 (three in number), which are formed on the substrate 11, correspond to different frequency bands. More specifically, the mesh wiring layers 20 have different lengths (lengths in the Y direction) $L_a$, each of which corresponds to a specific frequency band. The mesh wiring layers 20 corresponding to frequency bands with lower frequencies have longer lengths $L_a$. When, for example, the wiring board 10 is disposed on a display 91 of an image display device 90 (see FIG. 10 described below), each mesh wiring layer 20 may correspond to, for example, a telephone antenna, a WiFi antenna, a 3G antenna, a 4G antenna, a 5G antenna, an LTE antenna, a Bluetooth (registered trademark) antenna, or an NFC antenna. The mesh wiring layers 20 may be formed such that the mesh wiring layers 20 do not extend over the entire region of the substrate 11 but exist only in partial regions on the substrate 11.

Each mesh wiring layer 20 is substantially rectangular in plan view. The longitudinal direction of each mesh wiring layer 20 is parallel to the Y direction, and the transverse direction of each mesh wiring layer 20 is parallel to the X direction. A length $L_a$ of each mesh wiring layer 20 in the longitudinal direction (Y direction) may be selected from the range of, for example, 3 mm or more and 100 mm or less. A width $W_a$ of each mesh wiring layer 20 in the transverse direction (X direction) may be selected from the range of, for example, 1 mm or more and 10 mm or less. The mesh wiring layers 20 may be millimeter wave antennas. When the mesh wiring layers 20 are millimeter wave antennas, the length $L_a$ of each mesh wiring layer 20 may be selected from the range of 1 mm or more and 10 mm or less, preferably 1.5 mm or more and 5 mm or less.

Each mesh wiring layer 20 includes metal lines that form a grid structure or a mesh structure having a pattern periodic in the X direction and the Y direction. In other words, each mesh wiring layer 20 has a pattern including portions extending in the X direction (second-direction wiring lines 22) and portions extending in the Y direction (first-direction wiring lines 21).

Figure 2:
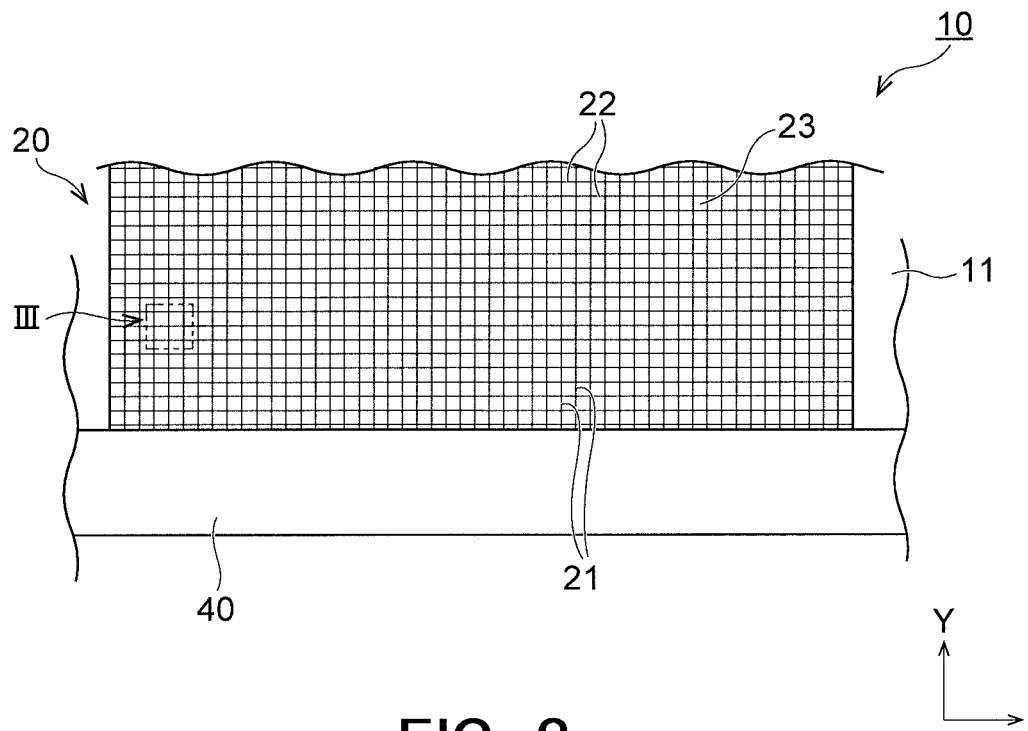
FIG. 2 is an enlarged plan view of the wiring board according to the embodiment (enlarged view of part II in FIG. 1).

As illustrated in FIG. 2, each mesh wiring layer 20 includes the first-direction wiring lines (antenna wiring lines) 21 that provide the function of an antenna and the second-direction wiring lines (antenna-connecting wiring lines) 22 that connect the first-direction wiring lines 21. More specifically, the first-direction wiring lines 21 and the second-direction wiring lines 22 are integrated together to form a grid structure or a mesh structure. Each first-direction wiring line 21 extends in a direction corresponding to the frequency band of the antenna (longitudinal direction, Y direction), and each second-direction wiring line 22 extends in a direction orthogonal to the first-direction wiring lines 21 (width direction, X direction). The first-direction wiring lines 21 have the length $L_a$ corresponding to a predetermined frequency band (above-described length of the mesh wiring layer 20, see FIG. 1) to mainly provide the function of an antenna. The second-direction wiring lines 22 connect the first-direction wiring lines 21 to each other to suppress defects such as breakage of the first-direction wiring lines 21 or electrical disconnection between each first-direction wiring line 21 and the feeding unit 40.

Figure 3:
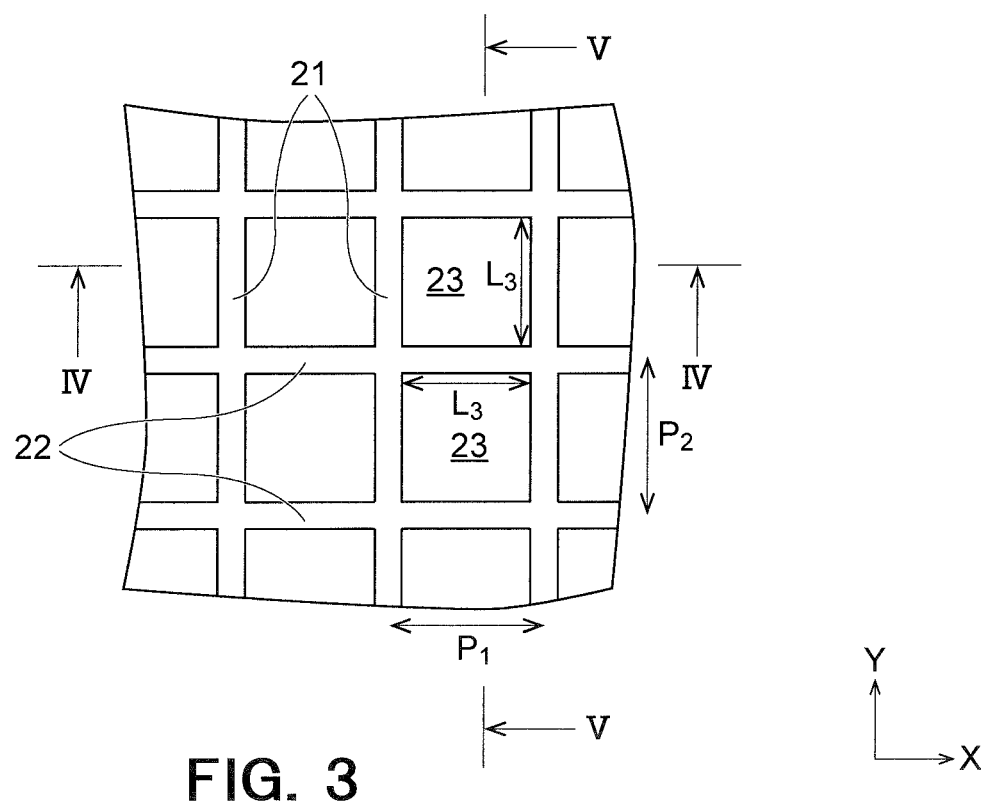
FIG. 3 is an enlarged plan view of the wiring board according to the embodiment (enlarged view of part III in FIG. 2).

As illustrated in FIG. 3, each mesh wiring layer 20 has a plurality of openings 23 that are each surrounded by adjacent ones of the first-direction wiring lines 21 and adjacent ones of the second-direction wiring lines 22. The first-direction wiring lines 21 and the second-direction wiring lines 22 are arranged at equal intervals. More specifically, the first-direction wiring lines 21 are arranged at equal intervals, and a pitch $P_1$ thereof may be in the range of, for example, 0.01 mm or more and 1 mm or less. The second-direction wiring lines 22 are arranged at equal intervals, and a pitch $P_2$ thereof may be in the range of, for example, 0.01 mm or more and 1 mm or less. Since the first-direction wiring lines 21 and the second-direction wiring lines 22 are both arranged at equal intervals as described above, differences in size between the openings 23 can be reduced in each mesh wiring layer 20, so that the mesh wiring layer 20 is not readily visible to the naked eye. The pitch $P_1$ of the first-direction wiring lines 21 is equal to the pitch $P_2$ of the second-direction wiring lines 22. The openings 23 are substantially square in plan view, and the substrate 11, which is transparent, is exposed at each opening 23. Therefore, the overall transparency of the wiring board 10 can be increased by increasing the area of each opening 23. A length $L_3$ of each side of each opening 23 may be in the range of, for example, 0.01 mm or more and 1 mm or less. Each first-direction wiring line 21 and each second-direction wiring line 22 are orthogonal to each other, but may instead cross each other at an acute or obtuse angle. The openings 23 preferably have the same shape and the same size over the entire region, but the shapes and sizes thereof may vary depending on the location and are not necessarily the same over the entire region.

Figure 4:
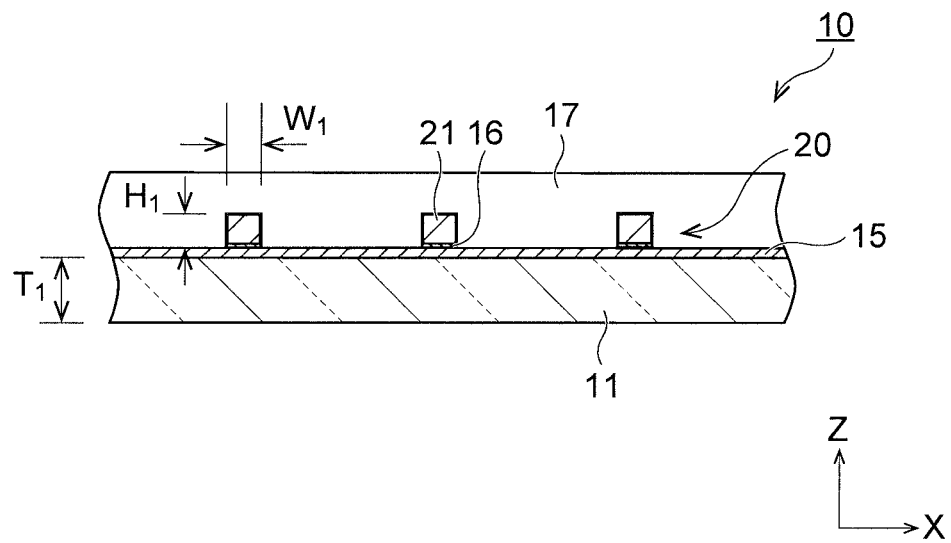
FIG. 4 is a sectional view of the wiring board according to the embodiment (sectional view of line VI-VI in FIG. 3).
Figure 5:
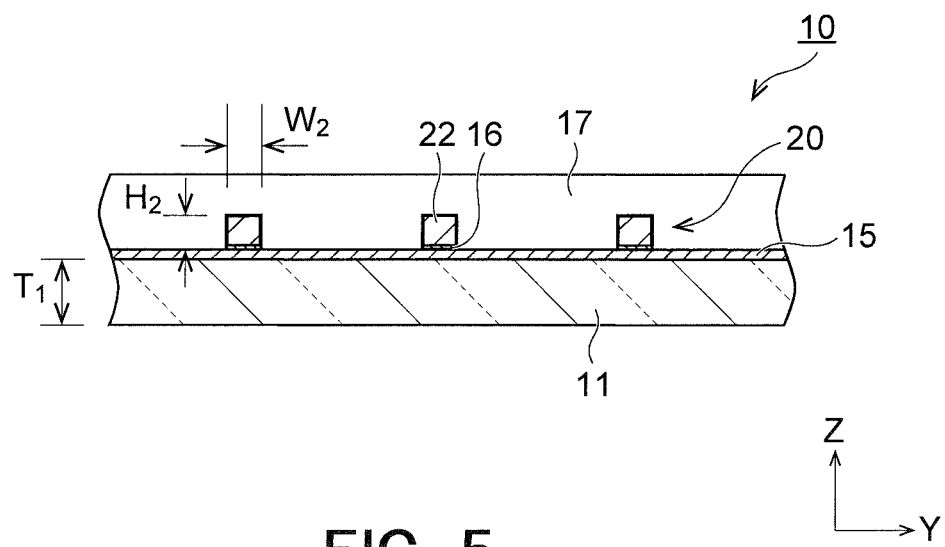
FIG. 5 is a sectional view of the wiring board according to the embodiment (sectional view of line V-V in FIG. 3).

As illustrated in FIG. 4, each first-direction wiring line 21 has a substantially rectangular or square cross section in a direction perpendicular to the longitudinal direction thereof (cross section in the X direction). The cross-sectional shape of each first-direction wiring line 21 is substantially uniform in the longitudinal direction of the first-direction wiring line 21 (Y direction). As illustrated in FIG. 5, each second-direction wiring line 22 has a substantially rectangular or square cross section in a direction perpendicular to the longitudinal direction thereof (cross section in the Y direction). The cross-sectional shape of each second-direction wiring line 22 is substantially the same as the above-described cross-sectional shape of each first-direction wiring line 21 (shape of cross section in the X direction). The cross-sectional shape of each second-direction wiring line 22 is substantially uniform in the longitudinal direction of the second-direction wiring line 22 (X direction). The cross-sectional shapes of each first-direction wiring line 21 and each second-direction wiring line 22 are not necessarily substantially rectangular or square. The cross-sectional shapes of each first-direction wiring line 21 and each second-direction wiring line 22 may be, for example, a substantially trapezoidal shape that is narrower at the front side (side facing in the positive Z direction) than at the back side (side facing in the negative Z direction), or a shape having curved side surfaces at both ends in the longitudinal direction.

In the present embodiment, a line width $W_1$ (dimension in the X direction, see FIG. 4) of the first-direction wiring lines 21 and a line width $W_2$ (dimension in the Y direction, see FIG. 5) of the second-direction wiring lines 22 are not particularly limited, and may be selected as appropriate depending on the use. For example, the line width $W_1$ of the first-direction wiring lines 21 may be selected from the range of 0.1 µm or more and 5.0 µm or less, preferably 0.2 µm or more and 2.0 µm or less. The line width $W_2$ of the second-direction wiring lines 22 may be selected from the range of 0.1 µm or more and 5.0 µm or less, preferably 0.2 µm or more and 2.0 µm or less. A height $H_1$ (dimension in the Z direction, see FIG. 4) of the first-direction wiring lines 21 and a height $H_2$ (dimension in the Z direction, see FIG. 5) of the second-direction wiring lines 22 are not particularly limited, and may be selected as appropriate depending on the use. For example, the heights $H_1$ and $H_2$ may be selected from the range of 0.1 µm or more and 5.0 µm or less, preferably 0.2 µm or more and 2.0 µm or less.

Figure 6:
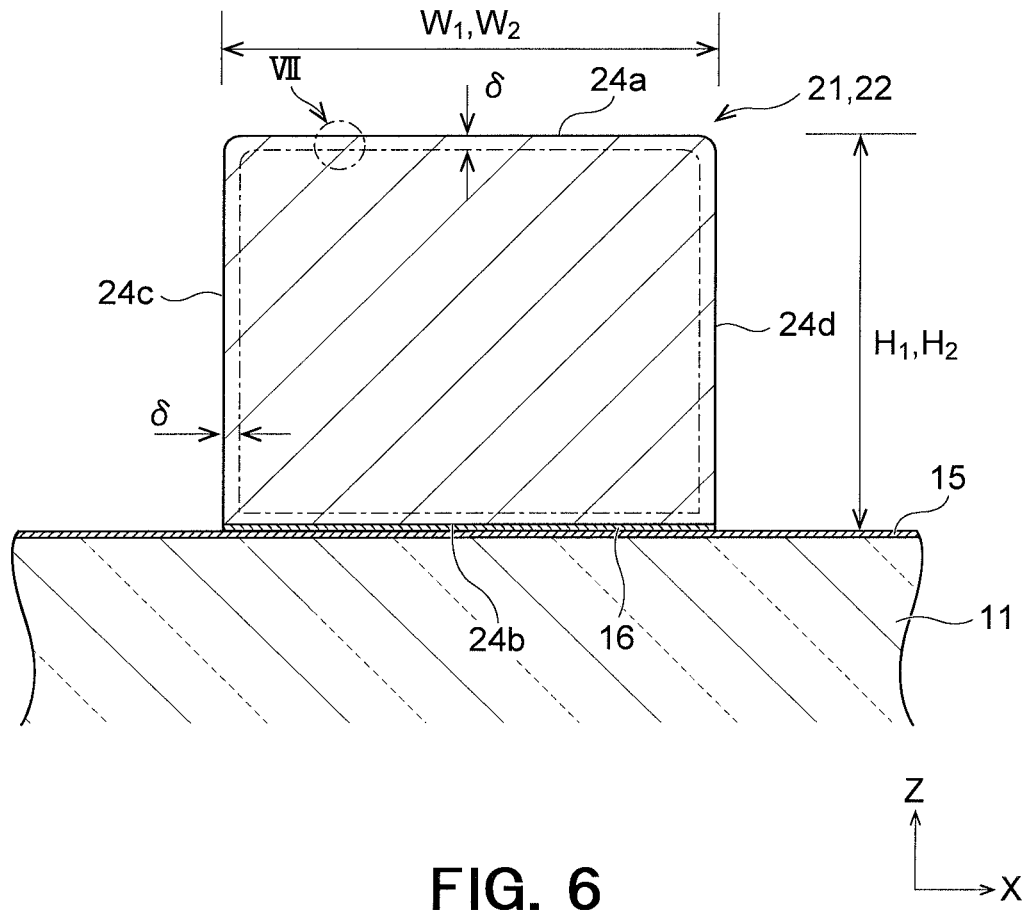
FIG. 6 is a sectional view of a first-direction wiring line and a second-direction wiring line.

FIG. 6 illustrates a cross section of each of the first-direction wiring lines 21 and the second-direction wiring lines 22 taken in the width direction (X direction, Y direction). Each of the first-direction wiring lines 21 and the second-direction wiring lines 22 has a front surface 24a, a back surface 24b, and two side surfaces 24c and 24d. The front surface 24a is positioned at a side of the first-direction wiring lines 21 and the second-direction wiring lines 22 viewed by a viewer during use (side facing in the positive Z direction). The back surface 24b is positioned opposite to the front surface 24a at a side facing the substrate 11 (side facing in the negative Z direction). The two side surfaces 24c and 24d are positioned between the front surface 24a and the back surface 24b at both sides of each of the first-direction wiring lines 21 and the second-direction wiring lines 22 in the width direction (X direction, Y direction). In this case, the front surface 24a is substantially orthogonal to the side surfaces 24c and 24d, and the back surface 24b is also substantially orthogonal to the side surfaces 24c and 24d. However, the surfaces are not limited to this, and may cross each other at an acute or obtuse angle. The front surface 24a, the back surface 24b, and the side surfaces 24c and 24d extend straight. However, the front surface 24a, the back surface 24b, and the side surfaces 24c and 24d are not limited to this, and may instead be curved.

Figure 7:
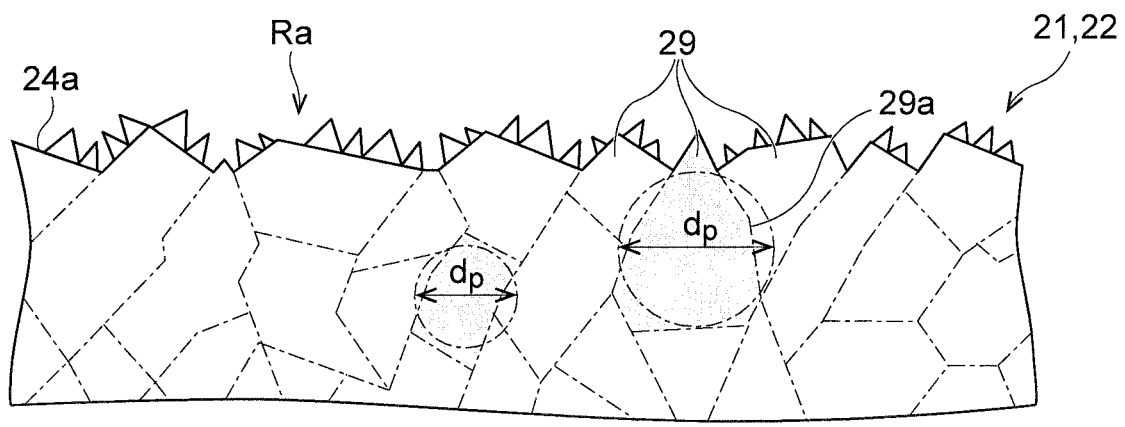
FIG. 7 is an enlarged partial sectional view of the first-direction wiring line and the second-direction wiring line (enlarged view of part VII in FIG. 6).

FIG. 7 is an enlarged schematic view of each of the first-direction wiring lines 21 and the second-direction wiring lines 22 in a region including the front surface 24a. Referring to FIG. 7, the size of crystal grains that appear on the cross section of each of the first-direction wiring lines 21 and the second-direction wiring lines 22 taken in the width direction thereof (X direction, Y direction) can be measured by an EBSD method.

The EBSD method is a method for analyzing crystal grains based on a diffraction pattern of an electron beam (hereinafter referred to also as an EBSD pattern) obtained when a test piece is irradiated with an electron beam in a direction greatly inclined with respect to the surface of the test piece by using, for example, a scanning electron microscope (hereinafter referred to also as an SEM). The measurement device may be, for example, a combination of a Schottky field emission scanning electron microscope and an EBSD detector. The EBSD detector may be, for example, an orientation imaging microscopy (OIM) detector manufactured by TSL Solutions K.K.

Before carrying out the EBSD method, the test piece may be subjected to preprocessing in which the cross section thereof is processed by a focus ion beam (FIB) method. In addition, before carrying out the FIB method, the test piece may be subjected to preprocessing in which carbon is applied to the surface thereof to a thickness of 200 nm or more to form a protective film. The protective film may instead be made of, for example, Pt, PtPd, or Os. The protective film may be formed by sputtering or vapor deposition. The protective film suppresses damage to the surface of a portion processed in the process by the FIB method. The thickness of the protective film may be adjusted as appropriate by adjusting processing conditions. An FIB device used in the FIB method may be any device as long as the device has a system capable of performing a process, such as microsampling, for picking up a sample from any location. For example, NB5000 manufactured by Hitachi High-Technologies Corporation may be used. The finishing thickness of a thin film formed on the cross section of the observed portion is 300 nm or more, and no problems occur when the thin film is thick. The finishing width of the thin film formed on the cross section of the observed portion may be, for example, 30 µm. The efficiency increases as the finishing width increases, although the efficiency depends also on the system installed in the FIB device.

The conditions of the scanning electron microscope used in the EBSD method may be, for example, as follows:
  Observation Magnification: 30000 (reference of magnification ×1 is 120 mm×90 mm)
  Acceleration Voltage: 15 kV
  Working Distance: 15 mm
  Test Piece Inclination Angle: 70 degrees The conditions of the crystal analysis by the EBSD method may be, for example, as follows:
  Step Size: 25 nm
Analysis Conditions:
  An analysis described below is performed by using crystal orientation analysis software OIM (Ver 7.3) produced by TSL Solutions K.K.

When the number of crystal grains that appear in a measurement region subjected to the analysis is less than 100, images may be obtained at a plurality of locations on the cross section of the test piece by moving the measurement region. The obtained images may be connected together to create an image in which 100 or more crystal grains appear.

The analysis is performed without using data with a confidence index (CI) of less than or equal to a predetermined value. The CI is defined by the crystal orientation analysis software OIM (Ver 7.3) produced by TSL Solutions K.K. For example, data with the CI of 0.2 or less is excluded. This enables elimination of the influence of the base material on the front and rear surfaces of the test piece, the protective film used in preprocessing, grain boundaries existing in the cross section of the test piece, and amorphous portions. As another method, data may be extracted from an Image Quality image assuming that regions in which the contrast is higher than or equal to a certain value are crystals. It is assumed that no twin grain boundaries are present, and only normal grain boundaries are counted.

Metal crystals 29 contained in the first-direction wiring lines 21 and the second-direction wiring lines 22 may have an area average grain size of 300 nm or more, preferably 400 nm or more. The area average grain size of the metal crystals 29 has no particular upper limit, but may be, for example, 1000 nm or less. When the area average grain size of the metal crystals 29 is 300 nm or more, as described below, the density of the metal crystals 29 is relatively low. Therefore, the total area of the grain boundaries is reduced, and electrodiffusion at the grain boundaries is reduced accordingly. As a result, reduction in current flow can be suppressed, and transmission loss of the electromagnetic waves can be reduced.

A grain size $d_p$ of each metal crystal 29 may be, for example, the size of the metal crystal 29 in cross section, as illustrated in FIG. 7. In other words, the grain size $d_p$ of each metal crystal 29 may be a diameter of a circle having the same area as that of the metal crystal 29 when the first-direction wiring lines 21 and the second-direction wiring lines 22 are observed in directions parallel to the longitudinal directions of the first-direction wiring lines 21 and the second-direction wiring lines 22. In a strict sense, the area average grain size of the metal crystals 29 is to be calculated as the average of the grain sizes $d_p$ of all of the metal crystals 29 contained in the first-direction wiring lines 21 and the second-direction wiring lines 22. However, considering the sizes of the metal crystals 29, for example, the area average grain size of the metal crystals 29 may be determined as the average of the grain sizes $d_p$ of a certain number of metal crystals 29 that are expected to represent the overall trend of the grain sizes $d_p$ of the metal crystals 29 in the first-direction wiring lines 21 and the second-direction wiring lines 22. For example, the area average grain size of the metal crystals 29 may be determined as the average of the grain sizes $d_p$ of five to fifty or more metal crystals 29 per region having a length of 3 μm to 30 μm in the longitudinal direction of the first-direction wiring lines 21 and the second-direction wiring lines 22.

The area average grain size of the metal crystals 29 is measured at a location separated from the ends of a measurement surface, such as a cross section of the first-direction wiring lines 21 and the second-direction wiring lines 22, when the size required for the measurement is less than that of the measurement surface. For example, when the position in the width direction of the first-direction wiring lines 21 and the second-direction wiring lines 22 can be determined, the measurement is performed at a location close to the center and separated from the ends in the width direction by a distance of 10% or more of the width of the first-direction wiring lines 21 and the second-direction wiring lines 22. When the position in the thickness direction of the first-direction wiring lines 21 and the second-direction wiring lines 22 can be determined, the measurement is performed at a location close to the center and separated from the ends in the thickness direction by a distance of 10% or more of the thickness of the first-direction wiring lines 21 and the second-direction wiring lines 22. As described above, the measurement may be performed at a certain number of locations, and the average of the measurement results may be determined as the area average grain size.

Referring to FIG. 7, the first-direction wiring lines 21 and the second-direction wiring lines 22 may have a surface roughness Ra of 100 nm or less, preferably 90 nm or less. The surface roughness Ra of the first-direction wiring lines 21 and the second-direction wiring lines 22 has no particular lower limit, but may be, for example, 5 nm or more. When the surface roughness Ra of the first-direction wiring lines 21 and the second-direction wiring lines 22 is 100 nm or less, as described below, electrons mainly flow along the surfaces of the first-direction wiring lines 21 and the second-direction wiring lines 22 due to the skin effect, particularly in a case where the frequency of the electromagnetic waves is high. Therefore, as the smoothness of the surface increases, that is, as the surface roughness Ra decreases, transmission loss of the electromagnetic waves can be reduced. The surface roughness Ra is an arithmetic mean roughness measured by using a contactless roughness meter. The contactless roughness meter may be a laser microscope VK-X250 (controller) manufactured by Keyence Corporation.

The surface roughness Ra of the first-direction wiring lines 21 and the second-direction wiring lines 22 is the surface roughness Ra of an outer surface of each of the first-direction wiring lines 21 and the second-direction wiring lines 22, more specifically, the surface roughness Ra of the front surface 24a of each of the first-direction wiring lines 21 and the second-direction wiring lines 22. The surface roughness Ra of the front surface 24a is preferably within the above-mentioned range over the entire area of the front surface 24a. However, the front surface 24a is not limited to this, and the surface roughness Ra of a portion thereof may be within the above-mentioned range. The surface roughness Ra of the first-direction wiring lines 21 and the second-direction wiring lines 22 is measured at a location separated from the ends of the front surface 24a in the width direction thereof. For example, the measurement is performed at a location close to the center and separated from the ends in the width direction by a distance of 10% or more of the width of the first-direction wiring lines 21 and the second-direction wiring lines 22. The measurement may be performed at one location, but may also be performed at a certain number of locations, and the average of the measurement results may be calculated.

In the present embodiment, as described above, it is preferable that (i) the area average grain size of the metal crystals 29 contained in the first-direction wiring lines 21 and the second-direction wiring lines 22 is 300 nm or more and (ii) the surface roughness Ra of the first-direction wiring lines 21 and the second-direction wiring lines 22 is 100 nm or less. However, this is not essential, and only one of the above conditions (i) and (ii) may be satisfied.

The material of the first-direction wiring lines 21 and the second-direction wiring lines 22 may be any conductive metal material. In the present embodiment, the material of the first-direction wiring lines 21 and the second-direction wiring lines 22 is copper. However, the material is not limited to this. Examples of the material of the first-direction wiring lines 21 and the second-direction wiring lines 22 include metal materials (including alloys), such as gold, silver, copper, platinum, tin, aluminum, iron, and nickel. The first-direction wiring lines 21 and the second-direction wiring lines 22 may be plating layers formed by electroplating.

As illustrated in FIGS. 4 and 5, an easily adhesive layer 15 is formed on the substrate 11. The easily adhesive layer 15, which increases adhesion between the substrate 11 and each of the first-direction wiring lines 21 and the second-direction wiring lines 22, is formed on the front surface of the substrate 11 over substantially the entire region thereof. The easily adhesive layer 15 is composed of an insulating film. The material of the easily adhesive layer 15 may be a colorless transparent resin, for example, an acrylic resin such as polymethyl (meth)acrylate, polyethyl (meth)acrylate, or a modified resin or copolymer thereof, a polyester, a polyvinyl resin such as polyvinyl alcohol, polyvinyl acetate, polyvinyl acetal, polyvinyl butyral, or a copolymer thereof, a polyurethane, an epoxy resin, a polyamide, or a chlorinated polyolefin. The thickness of the easily adhesive layer 15 may be set as appropriate in the range of 10 nm or more and 800 nm or less. The easily adhesive layer 15 may be formed on the front surface of the substrate 11 at least over each mesh wiring layer 20.

An adhesion enhancing layer 16 is formed on the easily adhesive layer 15. The adhesion enhancing layer 16 is located between the easily adhesive layer 15 and each of the first-direction wiring lines 21 and the second-direction wiring lines 22. The adhesion enhancing layer 16, which enhances the adhesion between the substrate 11 and each of the first-direction wiring lines 21 and the second-direction wiring lines 22, has the same shape as that of the first-direction wiring lines 21 and the second-direction wiring lines 22 in plan view. In other words, the adhesion enhancing layer 16 has a grid structure or a mesh structure in plan view. The material of the adhesion enhancing layer 16 may be, for example, titanium, titanium oxide, nickel, nickel oxide, or a metal oxide such as indium zinc oxide (IZO) or indium tin oxide (ITO). The thickness of the adhesion enhancing layer 16 may be selected from the range of 10 nm or more and 100 nm or less. It is not necessary that the adhesion enhancing layer 16 be provided.

A protective layer 17 is formed on the front surface of the substrate 11 so as to cover the first-direction wiring lines 21, the second-direction wiring lines 22, and the easily adhesive layer 15. The protective layer 17, which protects the first-direction wiring lines 21 and the second-direction wiring lines 22, is formed on the front surface of the substrate 11 over substantially the entire region thereof. The material of the protective layer 17 may be a colorless transparent insulating resin, for example, an acrylic resin such as polymethyl (meth)acrylate, polyethyl (meth)acrylate, or a modified resin or copolymer thereof, a polyester, a polyvinyl resin such as polyvinyl alcohol, polyvinyl acetate, polyvinyl acetal, polyvinyl butyral, or a copolymer thereof, a polyurethane, an epoxy resin, a polyamide, or a chlorinated polyolefin. The thickness of the protective layer 17 may be selected from the range of 0.3 µm or more and 10 µm or less. The protective layer 17 may be formed on the substrate 11 to at least cover each mesh wiring layer 20.

An overall opening ratio At of the mesh wiring layer 20 may be in the range of, for example, 87% or more and less than 100%. When the overall opening ratio At of the wiring board 10 is in this range, the wiring board 10 may be sufficiently conductive and transparent. The opening ratio is a ratio (%) of the area of the opening region (region in which metal portions, such as the first-direction wiring lines 21 and the second-direction wiring lines 22, are not present and in which the substrate 11 is exposed) to the unit area in a predetermined region (for example, the entire region of the mesh wiring layer 20).

Referring to FIG. 1 again, the feeding unit 40 is electrically connected to the mesh wiring layers 20. The feeding unit 40 is composed of a substantially rectangular thin plate-shaped conductive member. The longitudinal direction of the feeding unit 40 is parallel to the X direction, and the transverse direction of the feeding unit 40 is parallel to the Y direction. The feeding unit 40 is disposed at an end of the substrate 11 in the longitudinal direction of the substrate 11 (end in the negative Y direction). Examples of the material of the feeding unit 40 include metal materials (including alloys), such as gold, silver, copper, platinum, tin, aluminum, iron, and nickel. The feeding unit 40 is electrically connected to a wireless communication circuit 92 of an image display device 90 (see FIG. 10) when the wiring board 10 is installed in the image display device 90. Although the feeding unit 40 is provided on the front surface of the substrate 11, the feeding unit 40 is not limited to this, and a portion or the entirety thereof may instead be located outside the peripheral edge of the substrate 11. When the feeding unit 40 is formed to be flexible, the feeding unit 40 may be formed to extend to a side surface or a back surface of the image display device 90 to provide electrical connection at the side surface or the back surface.

[Method for Manufacturing Wiring Board]

A method for manufacturing a wiring board according to the present embodiment will now be described with reference to FIGS. 8A to 8E and FIGS. 9A to 9E. FIGS. 8A to 8E and FIGS. 9A to 9E are sectional views illustrating the method for manufacturing the wiring board according to the present embodiment.

Figure 8A:
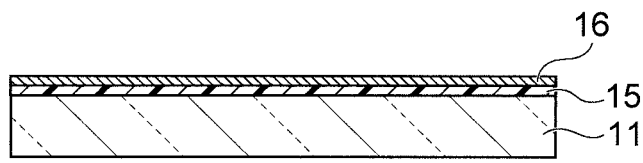
FIGS. 8A to 8E are sectional views illustrating a method for manufacturing the wiring board according to the embodiment.

First, as illustrated in FIG. 8A, the substrate 11 is prepared, and the easily adhesive layer 15 and the adhesion enhancing layer 16 are successively formed on the front surface of the substrate 11 over substantially the entire region thereof. The easily adhesive layer 15 may be formed by, for example, roll coating, gravure coating, gravure reverse coating, micro gravure coating, slot die coating, die coating, knife coating, inkjet coating, dispenser coating, kiss coating, or spray coating. The adhesion enhancing layer 16 may be formed by, for example, vapor deposition, sputtering, or plasma CVD.

Figure 8B:
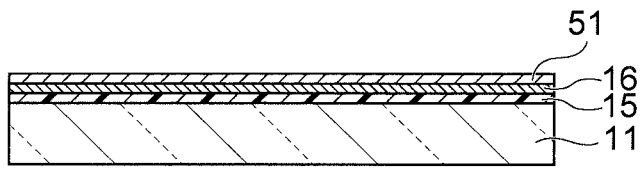

Next, as illustrated in FIG. 8B, a conductive layer 51 is formed on the adhesion enhancing layer 16 over substantially the entire region of the front surface of the substrate 11. In the present embodiment, the thickness of the conductive layer 51 is 200 nm. However, the thickness of the conductive layer 51 is not limited to this, and may be selected as appropriate from the range of 10 nm or more and 1000 nm or less. In the present embodiment, the conductive layer 51 is formed by sputtering by using copper. The conductive layer 51 may instead be formed by, for example, plasma CVD.

Figure 8C:
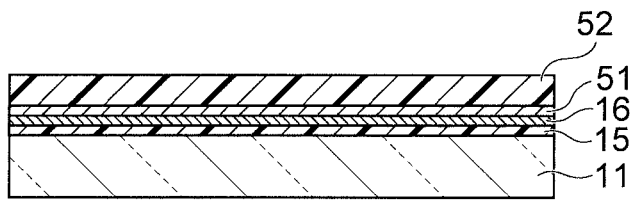

Next, as illustrated in FIG. 8C, a photocurable insulating resist 52 is applied to the conductive layer 51 over substantially the entire region of the front surface of the substrate 11. The photocurable insulating resist 52 may be, for example, an organic resin, such as an epoxy-based resin.

Figure 8D:
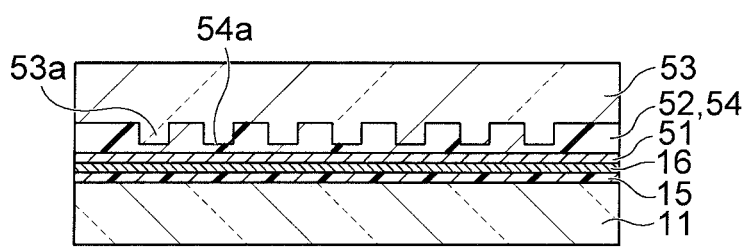

Subsequently, a transparent imprinting mold 53 having projections 53a is prepared (see FIG. 8D). This mold 53 is brought closer to the substrate 11 so that the photocurable insulating resist 52 spreads between the mold 53 and the substrate 11. Next, the photocurable insulating resist 52 is exposed to light through the mold 53 to cure the photocurable insulating resist 52, so that an insulating layer 54 is formed. Thus, trenches 54a having shapes obtained by transferring the shapes of the projections 53a are formed on the front surface of the insulating layer 54. The trenches 54a have a pattern corresponding to the first-direction wiring lines 21 and the second-direction wiring lines 22 in plan view.

Figure 8E:
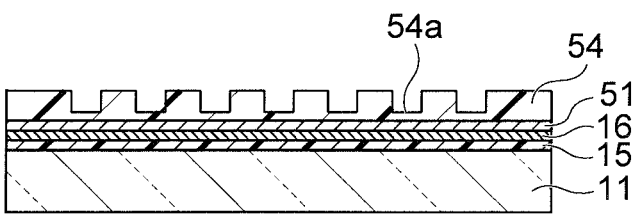

After that, the mold 53 is separated from the insulating layer 54, so that the insulating layer 54 having a cross-sectional structure illustrated in FIG. 8E is obtained. The direction in which the mold 53 is separated from the insulating layer 54 is preferably the Y direction in which the first-direction wiring lines 21, which are the longer wiring lines, extend.

Since the trenches 54a are formed on the front surface of the insulating layer 54 by imprinting, the trenches 54a can be formed in a fine shape. The method for forming the insulating layer 54 is not limited to this, and the insulating layer 54 may instead be formed by photolithography. In such a case, a resist pattern is formed by photolithography so that portions of the conductive layer 51 that correspond to the first-direction wiring lines 21 and the second-direction wiring lines 22 are exposed.

An insulating material may remain at the bottom of the trenches 54a in the insulating layer 54. Therefore, the remaining insulating material is removed by a wet process using a permanganate solution or an organic solvent, such as N-Methyl-2-pyrrolidone, or a dry process using an oxygen plasma.

Figure 9A:
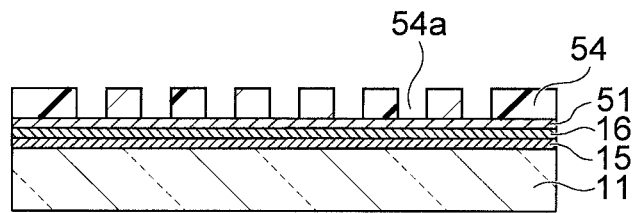
FIGS. 9A to 9E are sectional views illustrating the method for manufacturing the wiring board according to the embodiment.

By removing the remaining insulating material as described above, the trenches 54a at which the conductive layer 51 is exposed are formed as illustrated in FIG. 9A.

Figure 9B:
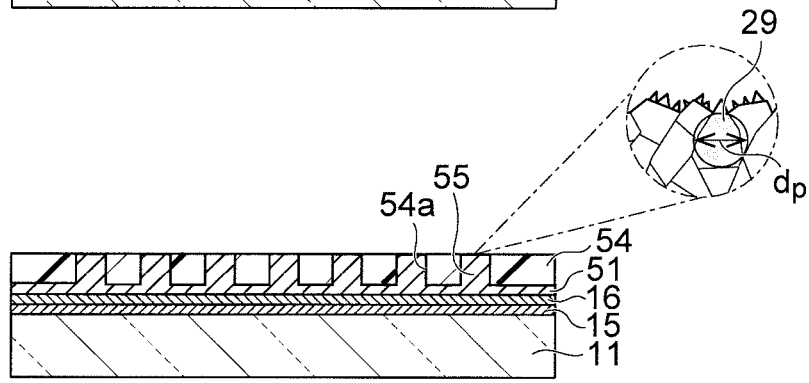

Next, as illustrated in FIG. 9B, the trenches 54a in the insulating layer 54 are filled with a conductor 55. In the present embodiment, the trenches 54a in the insulating layer 54 are filled with copper by electroplating by using the conductive layer 51 as a seed layer. The conductor 55 is formed in a pattern corresponding to that of the first-direction wiring lines 21 and the second-direction wiring lines 22 in plan view.

When the trenches 54a are filled with the conductor 55 by electroplating, a plating solution used in the electroplating process, for example, may be adjusted as appropriate so that (i) the area average grain size of the metal crystals 29 contained in the conductor 55 (first-direction wiring lines 21 and second-direction wiring lines 22) is 300 nm or more and/or (ii) the surface roughness Ra of the conductor 55 (first-direction wiring lines 21 and second-direction wiring lines 22) is 100 nm or less. For example, when the conductor 55 is made of copper and when copper sulfate bath containing copper sulfate as the main component is used as the plating solution, the crystal growth rate can be reduced by appropriately adjusting various components of the plating solution, such as copper sulfate, sulfuric acid, and a brightener including a surface active agent. As a result, the area average grain size of the metal crystals 29 contained in the conductor 55 can be increased, and the surface roughness Ra of the conductor 55 can be reduced. When the plating solution contains copper sulfate as the main component as described above, compared to when a common plating solution containing copper cyanide as the main component is used, the area average grain size of the metal crystals 29 contained in the conductor 55 can be increased and smoothness of the outer surface of the conductor 55 can be improved.

Figure 9C:
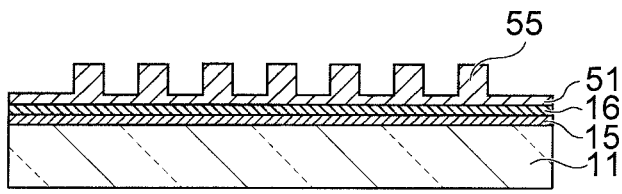

Next, as illustrated in FIG. 9C, the insulating layer 54 is removed. The insulating layer 54 on the substrate 11 is removed by a wet process using a permanganate solution or an organic solvent, such as N-Methyl-2-pyrrolidone, or a dry process using an oxygen plasma.

Figure 9D:
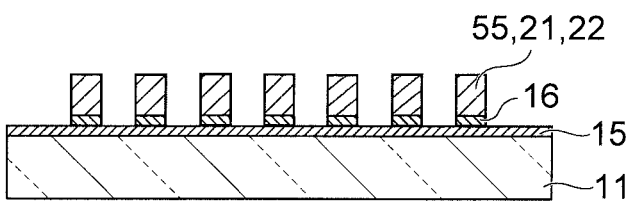

Next, as illustrated in FIG. 9D, the conductive layer 51 and the adhesion enhancing layer 16 on the front surface of the substrate 11 are removed. The conductive layer 51 and the adhesion enhancing layer 16 are etched so that the front surface of the substrate 11 is exposed by a wet process using a copper etching solution, such as an aqueous solution of ferric chloride, an aqueous solution of cupric chloride, an aqueous solution of ammonium peroxodisulfate, an aqueous solution of sodium peroxodisulfate, sulfuric acid, or aqueous hydrogen peroxide. After that, a blackened layer may be formed on the surface of the conductor 55 (first-direction wiring lines 21 and the second-direction wiring lines 22).

Figure 9E:
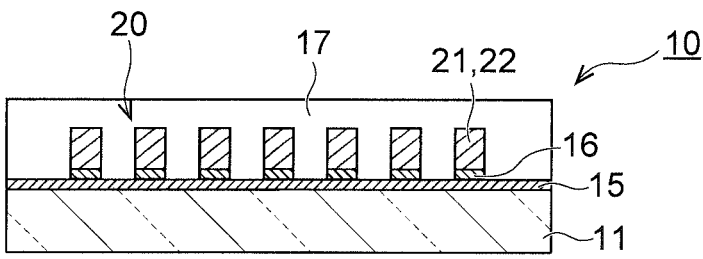
Figure 9E:
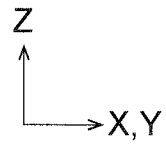

After that, as illustrated in FIG. 9E, the protective layer 17 is formed to cover the easily adhesive layer 15, the conductor 55, and the adhesion enhancing layer 16 on the substrate 11. The protective layer 17 may be formed by, for example, roll coating, gravure coating, gravure reverse coating, micro gravure coating, slot die coating, die coating, knife coating, inkjet coating, dispenser coating, kiss coating, spray coating, screen printing, offset printing, or flexographic printing.

Thus, the wiring board 10 including the substrate 11 and the mesh wiring layers 20 arranged on the substrate 11 is obtained (FIG. 9E). The mesh wiring layers 20 each include the first-direction wiring lines 21 and the second-direction wiring lines 22. The feeding unit 40 may be formed of a portion of the conductor 55. Alternatively, a flat plate-shaped feeding unit 40 may be separately prepared, and the thus-prepared feeding unit 40 may be electrically connected to the mesh wiring layers 20.

Operations of Present Embodiment

The operations of the wiring board having the above-described structure will now be described.

Figure 10:
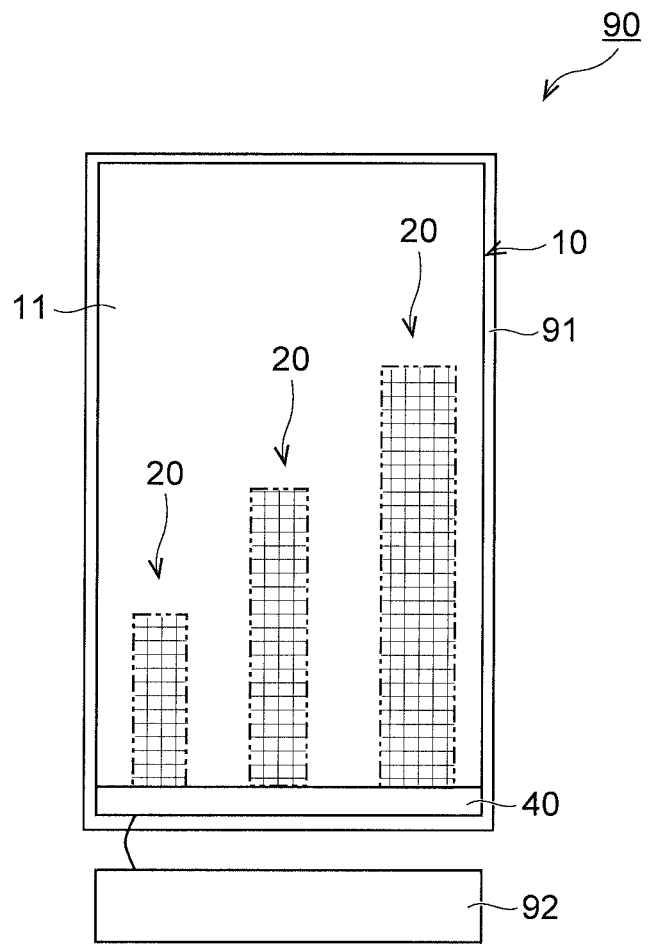
FIG. 10 is a plan view of an image display device according to an embodiment.

As illustrated in FIG. 10, the wiring board 10 is installed in the image display device 90 having the display 91. The wiring board 10 is disposed on the display 91. The image display device 90 may be, for example, a portable terminal device, such as a smartphone or a tablet. The mesh wiring layers 20 of the wiring board 10 are electrically connected to the wireless communication circuit 92 of the image display device 90 through the feeding unit 40. Thus, radio waves of predetermined frequencies can be transmitted and received through the mesh wiring layers 20. This enables communication using the image display device 90.

In recent years, high-frequency electromagnetic waves have been used, and electrons pass through grain boundaries in the metal forming the mesh wiring layers 20 a greater number of times per unit time. Therefore, current flow may be reduced, and transmission loss may be increased.

In contrast, according to the present embodiment, (i) the area average grain size of the metal crystals 29 contained in the first-direction wiring lines 21 and the second-direction wiring lines 22 is 300 nm or more; and/or (ii) the surface roughness Ra of the first-direction wiring lines 21 and the second-direction wiring lines 22 is 100 nm or less. Thus, the density of the metal crystals 29 is relatively low. Therefore, the total area of the grain boundaries is reduced, and electrodiffusion at the grain boundaries is reduced accordingly. As a result, reduction in current flow can be suppressed, and transmission loss of the electromagnetic waves can be reduced. In addition, since the surfaces of the first-direction wiring lines 21 and the second-direction wiring lines 22 are smooth, transmission loss of the electromagnetic waves can be reduced.

In addition, in recent years, mobile terminal devices for fifth-generation (5G) communications have been developed. When the mesh wiring layers 20 of the wiring board 10 are used as, for example, 5G antennas (in particular, millimeter wave antennas), the frequency of radio waves (millimeter waves) transmitted and received by the mesh wiring layers 20 is higher than that of radio waves transmitted and received by, for example, 4G antennas. In general, when an alternating current is applied to a wiring line, the current flow in a central region of the wiring line is reduced as the frequency is increased. Accordingly, the current flows along the surface of the wiring line. The phenomenon in which an alternating current applied to a wiring line flows only along the surface of the wiring line is referred to as the skin effect. A skin depth is the depth from the surface of the wiring line at which the current is reduced to 1/e (about 0.37) times the current along the surface of the wiring line at which the current most easily flows. In general, the skin depth $\delta$ (see FIG. 6) can be determined by the following equation.

$$\delta = \sqrt{\frac{2}{\omega\mu\sigma}} \qquad \text{[Math. 1]}$$

In the above equation, ω is the angular frequency (=2πf), μ is the permeability ($4\pi \times 10^{-7}$ [H/m] in vacuum), and σ is the conductivity of the conductor that forms the wiring lines ($5.8 \times 10^7$ [S/m] for copper). The skin depth δ of the wiring lines made of copper is about 2.3 μm when the frequency is 0.8 GHz, about 1.3 μm when the frequency is 2.4 GHz, about 1.0 μm when the frequency is 4.4 GHz, and about 0.85 μm when the frequency is 6 GHz. The frequency of radio waves (millimeter waves) transmitted and received by a 5G antenna (28 GHz to 39 GHz) is higher than the frequency of radio waves transmitted and received by, for example, a 4G antenna. When, for example, the frequency of the current is 28 GHz to 39 GHz, δ is about 0.3 μm to about 0.4 μm.

Accordingly, as the smoothness of the surfaces of the mesh wiring layers 20 is increased, that is, as the surface roughness Ra is reduced, increase in the skin resistance of the wiring lines is suppressed, and transmission loss can be reduced during transmission and reception of radio waves. In contrast, in a comparative example in which the surface roughness Ra of the wiring lines is large, the skin resistance of the wiring lines is increased, and transmission loss may occur during transmission and reception of radio waves. In particular, when high-frequency radio waves (millimeter waves) are transmitted and received by the mesh wiring layers 20, the skin resistance of the first-direction wiring lines 21 and the second-direction wiring lines 22 can be reduced by forming the first-direction wiring lines 21 and the second-direction wiring lines 22 such that the surface roughness Ra is 100 nm or less. Therefore, reduction in current flow through the mesh wiring layers 20 due to the skin resistance of the first-direction wiring lines 21 and the second-direction wiring lines 22 can be suppressed.

In addition, according to the present embodiment, the line width of the first-direction wiring lines 21 and the second-direction wiring lines 22 is 0.1 μm or more and 5.0 μm or less. Accordingly, the first-direction wiring lines 21 and the second-direction wiring lines 22 are not readily visible to the naked eye, and reduction in visibility of the display 91 can be suppressed.

In addition, according to the present embodiment, the dielectric loss tangent of the substrate 11 is 0.002 or less. Accordingly, when high-frequency radio waves (millimeter waves) are transmitted and received by the mesh wiring layers 20, dielectric loss can be reduced during transmission and reception of the radio waves.

In addition, according to the present embodiment, the first-direction wiring lines 21 and the second-direction wiring lines 22 are made of plating layers. Therefore, the height $H_1$ of the first-direction wiring lines 21 and the height $H_2$ of the second-direction wiring lines 22 can be increased.

In addition, according to the present embodiment, since the easily adhesive layer 15 is formed on the substrate 11, the adhesion between the substrate 11 and each of the first-direction wiring lines 21 and the second-direction wiring lines 22 can be increased. In addition, since the adhesion enhancing layer 16 is formed on the easily adhesive layer 15, the adhesion between the substrate 11 and each of the first-direction wiring lines 21 and the second-direction wiring lines 22 can be further enhanced.

In addition, according to the present embodiment, the protective layer 17 is formed on the substrate 11 so as to cover the first-direction wiring lines 21 and the second-direction wiring lines 22. Therefore, the first-direction wiring lines 21 and the second-direction wiring lines 22 can be protected from, for example, external impacts.

In addition, according to the present embodiment, each mesh wiring layer 20 has a function of an antenna. The mesh wiring layer 20 that functions as an antenna can be disposed on the outermost surface of the image display device 90. Therefore, the communication performance is higher than when an antenna is mounted in the image display device 90. In addition, since a plurality of mesh wiring layers 20 that function as antennas can be arranged along the surface of the image display device 90, the communication performance can be improved.

In particular, when the mesh wiring layers 20 are used as antennas, degradation of performance of the antennas, more specifically the antenna performance such as S11, can be suppressed. Here, S11 is, for example, a value obtained by dividing the electric power reflected by an input terminal of an antenna by electric power input to the input terminal of the antenna. A network analyzer, for example, may be used to measure S11.

Although the mesh wiring layers 20 function as antennas in the example described in the present embodiment, the mesh wiring layers 20 are not limited to this. The mesh wiring layers 20 may instead have functions of, for example, hovering (function for enabling operation by the user without direct contact with a display), fingerprint authentication, heating, or noise filtering (shielding). Also in these cases, the current flow through the mesh wiring layers 20 can be facilitated.

In addition, in the example described in the present embodiment, the first-direction wiring lines 21 and the second-direction wiring lines 22 are both formed so that (i) the area average grain size of the metal crystals 29 contained in the first-direction wiring lines 21 and the second-direction wiring lines 22 is 300 nm or more; and/or (ii) the surface roughness Ra of the first-direction wiring lines 21 and the second-direction wiring lines 22 is 100 nm or less. However, the first-direction wiring lines 21 and the second-direction wiring lines 22 are not limited to this, and may instead be such that only the first-direction wiring lines 21 or the second-direction wiring lines 22 are formed so that (i) the area average grain size of the metal crystals 29 contained in the first-direction wiring lines 21 and the second-direction wiring lines 22 is 300 nm or more; and/or (ii) the surface roughness Ra of the first-direction wiring lines 21 and the second-direction wiring lines 22 is 100 nm or less.

EXAMPLES

Examples of the present embodiment will now be described.

(Production of Mesh Pattern)

Wiring boards according to Examples and Comparative Example were prepared as described below.

Example 1

Figure 11:
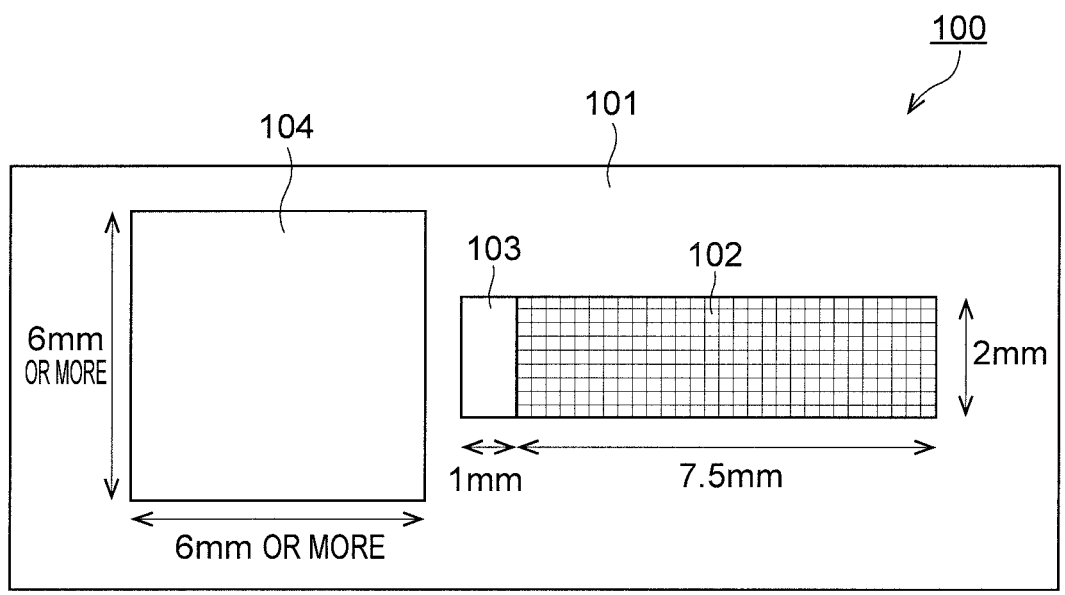
FIG. 11 is a plan view of wiring boards according to Examples 1 and 2 and Comparative Example 1.

A copper mesh pattern was formed on a substrate composed of a PET film by electroplating by using a plating solution containing copper sulfate as the main component. Thus, a wiring board 100 including a substrate 101 and a mesh wiring layer 102 was obtained (see FIG. 11). The mesh wiring layer 102 had a size of 2 mm in width and 7.5 mm in length, and a solid region 103 made of copper and having the same width (2 mm) and a length of 1 mm was formed at a longitudinal end of the mesh wiring layer 102 having the length of 7.5 mm. The mesh wiring layer 102 and the solid region 103 made of copper were electrically connected to each other. A solid region (ground) 104 made of copper and having a width of 6 mm or more and a length of 6 mm or more was formed at a location separated from the solid region 103 made of copper by 1 to 2 mm. The mesh wiring layer 102 was grid-shaped, and the solid regions 103 and 104 were solid. The line width of the wiring lines was 1 μm in both the width direction and the length direction of the mesh wiring layer 102. The height of the wiring lines was 1 μm, and the pitch of the wiring lines was 100 μm. The height of the solid regions 103 and 104 was 1 μm.

Example 2

A wiring board of Example 2 was produced similarly to Example 1 except for the components of the plating solution used to form the mesh wiring layer 102 and the solid regions 103 and 104.

Comparative Example 1

A wiring board of Comparative Example 1 was produced similarly to Example 2 except for the components of the plating solution used to form the mesh wiring layer 102 and the solid regions 103 and 104.

The area average grain size of copper crystals and the surface roughness Ra of the wiring lines were measured for each of the wiring boards 100 according to Examples and Comparative Example. The area average grain size of copper crystals was analyzed by the SEM-EBSD method. The surface roughness Ra of the wiring lines was measured by using a laser microscope (VK-X250 (controller) and VK-X260 (measurement unit) manufactured by Keyence Corporation, laser wavelength 408 nm).

A G signal of a coaxial cable was connected to the solid region 104 made of copper and having a width of 6 mm or more and a length of 6 mm or more, and an S signal of the coaxial cable was connected to the solid region 103 at the end of the mesh pattern. Then, S11 of the mesh wiring layer 102 at 8 to 12 GHz was measured by using a vector network analyzer (8722ES manufactured by Agilent Technologies, Inc.).

A wiring board with a peak of −10 dB or less was rated "excellent (E)", a wiring board with a peak of −8 dB or less was rated "good (G)", and a wiring board with no peak of −8 dB or less was rated "poor (P)". The results are shown in Table 1.

TABLE 1

|  | Example 1 | Example 2 | Comparative Example 1 |
|---|---|---|---|
| Area Average Grain Size of Copper Crystals [nm] | 776 | 406 | 167 |
| Surface Roughness Ra of Wiring Lines [nm] | 76 | 60 | 132 |
| Rating | E | E | P |

The components of the above-described embodiment and modifications may be applied in combination with each other as necessary. Also, some of the components of the above-described embodiment and modifications may be omitted.

The invention claimed is:

1. A wiring board comprising:
a substrate; and
a mesh wiring layer disposed on the substrate and including a plurality of wiring lines,
wherein the substrate has a transmittance of 85% or more for light with a wavelength of 400 nm or more and 700 nm or less,
wherein the wiring lines have a surface roughness Ra, and the surface roughness Ra is 100 nm or less, and
wherein the wiring lines comprise metal crystals, and an area average grain size of the metal crystals is 300 nm or more.

2. The wiring board according to claim 1, wherein the wiring lines have a line width of 0.1 μm or more and 5.0 μm or less.

3. The wiring board according to claim 1, wherein the mesh wiring layer is an antenna.

4. The wiring board according to claim 1, wherein the wiring lines comprise gold, silver, copper, platinum, tin, aluminum, iron, or nickel.

5. The wiring board according to claim 1, wherein the substrate has a dielectric loss tangent of 0.002 or less.

6. The wiring board according to claim 1, wherein the substrate has a thickness of 5 μm or more and 200 μm or less.

7. The wiring board according to claim 1, wherein the substrate comprises cycloolefin polymer or polynorbornene polymer.

8. The wiring board according to claim 1, wherein the mesh wiring layer is provided only on a portion of the substrate.

9. The wiring board according to claim 1, wherein the surface roughness Ra is 90 nm or less.

10. A method for manufacturing a wiring board, the method comprising:
a step of preparing a substrate; and
a step of forming a mesh wiring layer including a plurality of wiring lines on the substrate,
wherein the substrate has a transmittance of 85% or more for light with a wavelength of 400 nm or more and 700 nm or less,
wherein the wiring lines have a surface roughness Ra, and the surface roughness Ra is 100 nm or less, and
wherein the wiring lines comprise metal crystals, and an area average grain size of the metal crystals is 300 nm or more.

11. The method for manufacturing a wiring board according to claim 10, wherein the wiring lines have a line width of 0.1 μm or more and 5.0 μm or less.

12. The method for manufacturing a wiring board according to claim 10, wherein the mesh wiring layer is an antenna.

13. The method for manufacturing a wiring board according to claim 10, wherein the wiring lines comprise gold, silver, copper, platinum, tin, aluminum, iron, or nickel.

14. The method for manufacturing a wiring board according to claim 10, wherein the substrate has a dielectric loss tangent of 0.002 or less.

15. The method for manufacturing a wiring board according to claim 10, wherein the substrate has a thickness of 5 μm or more and 200 μm or less.

16. The method for manufacturing a wiring board according to claim 10, wherein the substrate comprises cycloolefin polymer or polynorbornene polymer.

17. The method for manufacturing a wiring board according to claim 10, wherein the mesh wiring layer is provided only on a portion of the substrate.

18. The method for manufacturing a wiring board according to claim 10, wherein the surface roughness Ra is 90 nm or less.

* * * * *